(12) United States Patent
Martin

(10) Patent No.: US 9,557,356 B2
(45) Date of Patent: Jan. 31, 2017

(54) UTILITY METER WITH WIRELESS PULSE OUTPUT

(71) Applicant: Landis+Gyr, Inc., Lafayette, IN (US)

(72) Inventor: Warren Thomas Martin, Lafayette, IN (US)

(73) Assignee: Landis+Gyr Inc., Lafayette, IN (US)

( * ) Notice: Subject to any disclaimer, the term of this patent is extended or adjusted under 35 U.S.C. 154(b) by 163 days.

(21) Appl. No.: 14/280,158

(22) Filed: May 16, 2014

(65) Prior Publication Data

US 2014/0247036 A1 Sep. 4, 2014

Related U.S. Application Data

(63) Continuation of application No. 13/077,541, filed on Mar. 31, 2011, now Pat. No. 8,731,854.

(60) Provisional application No. 61/319,717, filed on Mar. 31, 2010.

(51) Int. Cl.
| | |
|---|---|
| *G06F 19/00* | (2011.01) |
| *G01R 21/06* | (2006.01) |
| *G01D 4/00* | (2006.01) |
| *H02J 13/00* | (2006.01) |

(52) U.S. Cl.
CPC .............. *G01R 21/06* (2013.01); *G01D 4/002* (2013.01); *H02J 13/0075* (2013.01); *Y02B 90/241* (2013.01); *Y02B 90/248* (2013.01); *Y02E 60/7853* (2013.01); *Y04S 20/32* (2013.01); *Y04S 20/52* (2013.01); *Y04S 40/126* (2013.01)

(58) Field of Classification Search
CPC .. G01R 15/202; G01R 19/2506; G01R 21/133
USPC .............................. 702/61–64, 182–185, 188
See application file for complete search history.

(56) References Cited

U.S. PATENT DOCUMENTS

2007/0059986 A1* 3/2007 Rockwell ....................... 439/638

* cited by examiner

*Primary Examiner* — Edward Raymond
(74) *Attorney, Agent, or Firm* — Maginot Moore & Beck LLP

(57) ABSTRACT

An arrangement for measuring electrical energy consumption includes an input circuit operable to generate a first signal representative of a line voltage waveform and a second signal representative of a line current waveform. The arrangement further includes a processing circuit operable to generate energy consumption data based on the first signal and the second signal. The processing circuit is further operable to generate a first pulse waveform having a plurality of output pulses based on the energy consumption data, each output pulse corresponding to a quantity of energy consumed. The arrangement further includes a wireless transmitter coupled to the processing circuit, the wireless transmitter configured to transmit an RF signal each time the first pulse waveform changes state.

19 Claims, 3 Drawing Sheets

US 9,557,356 B2

UTILITY METER WITH WIRELESS PULSE OUTPUT

CROSS-REFERENCE TO RELATED APPLICATIONS

This application is a continuation of U.S. patent application Ser. No. 13/077,541, filed Mar. 31, 2011, which in turn claims priority from U.S. Provisional Patent Application Ser. No. 61/319,717, filed Mar. 31, 2010, both of which are incorporated herein by reference in its entirety.

BACKGROUND

Electricity meters are widely used for measuring electrical energy consumption. FIG. 1 shows a diagram of an exemplary conventional electricity meter 10 configured to measure power flowing the power lines 9 to a facility. The electricity meter 10 includes an input circuit 11 configured to sense current and voltage on the power lines 9. The electricity meter 10 also includes a processing circuit 12 that is configured to receive the sensed current and voltage from the input circuit 11 and provide information representative of energy consumption to various outputs. The outputs may include a meter display 14 and an automatic meter reading (AMR) communications module 15. Another output that may be provided in conventional electricity meters is the optical communications port 16, which allows for optical communications to and from the processing circuit 12. Yet another output that is provided on many conventional electricity meters is the pulse wave output 17, which is configured to be hard-wired to an external device 18 that is housed completely separate from the meter 10.

The pulse wave output 17 is configured to receive output pulses from the processing circuit 12 that represent an energy metric measured by the meter 10. For example, it is known for a meter to generate so-called "KYZ pulses" that are representative of energy consumption. FIG. 2a shows an exemplary "alternating state" pulse train 20 that is representative of a KY or KZ pulse waveform. The waveform consists of a series of pulses 21, 22, 23, 24, 25, 26 and 27 wherein each pulse merely changes the signal logic state and remains in that logic state until the next pulse. In a KY or KZ pulse waveform, each change in state (e.g., on to off/high to low) is representative of a quantity of electrical energy consumed. FIG. 2b shows a differential alternating state pulse train 25 which includes two identical pulse trains 26 and 27 having opposite polarity. Such a differential pulse train 25 is used in many meters and is often referred to as a "KYZ pulse signal".

With reference again to FIG. 1, the pulse wave output is provided by a KYZ output/input card 17 or other interface/device configured to deliver a KYZ pulse signal (such as that shown in FIG. 2a or 2b). It is known to use the output pulses delivered from the electricity meter's pulse wave output 17 in a device external to the meter for various purposes. For example, the external device 18 may use the output pulses of a KYZ pulse (or other pulse) for load control, a rate indicator, an end-of-interval, or for other kinds of control inputs as will be recognized by those of skill in the art. Accordingly, exemplary external devices 18 include load control devices, rate indicators, pulse recorders or the like.

As mentioned above, in current implementation, the pulse wave output 17 of the meter is wired to a receiver of an external device 18, such as a building control system device or other output device that is external to the meter. One drawback of the wired connection between the pulse wave output 17 of the meter 10 and the external device 18 is the difficulty of protecting the interface for the pulse wave output 17 in the meter 10 and the receiver at the external device 18 from high voltage spikes when the electrical system is excited by high voltage from equipment operations or lightening strikes. In particular, some metering systems are connected to ungrounded electrical service, and can experience voltage surges in excess of a few thousand volts. It is not uncommon for these voltage spikes to exceed the 4 KV isolation provided in the equipment. When the meter 10 is completely isolated from ground, with no connection to a grounded external device 18, such spikes are not necessarily problematic. However, when the meter 10 is wired to an external device 18 having a local ground, problems can exist. In particular, because of the wiring between the pulse wave output 17 of the meter 10 and the receiver of the external device 18, a path to ground is provided via the external devices 18. Thus, large voltage spikes in an ungrounded meter 10 may result in damage to the equipment, including damage to the processor 12, the interface of the pulse wave output 17, the receiver of the external device 18, and other equipment.

In view of the above, it would be advantageous to provide an arrangement for measuring electrical energy consumption where an ungrounded electricity meter is protected from voltage spikes.

SUMMARY

The present invention overcomes these above-mentioned drawbacks by removing the direct electrical connection between the pulse output interface of the meter and the receiver of the external device. In addition, the reverse connections from control inputs or external data inputs of the external device to the meter are also removed.

In at least one exemplary embodiment, an arrangement for measuring electrical energy consumption includes an input circuit operable to generate a first signal representative of a line voltage waveform and a second signal representative of a line current waveform. The arrangement further includes a processing circuit operable to generate energy consumption data based on the first signal and the second signal. The processing circuit is further operable to generate a first pulse waveform having a plurality of output pulses based on the energy consumption data, each output pulse corresponding to a quantity of energy consumed. The arrangement further includes a wireless transmitter coupled to the processing circuit, the wireless transmitter configured to transmit an RF signal each time the first pulse waveform changes state. The arrangement also includes an external device positioned remote from the electrical utility meter, the external device including a receiver configured to receive the RF signal.

In accordance with another exemplary embodiment, a utility meter includes an input circuit coupled to ungrounded electrical service. The input circuit is operable to generate a first signal representative of a line voltage waveform and a second signal representative of a line current waveform. The utility meter also includes a processing circuit operable to generate energy consumption data based on the first signal and the second signal. The processing circuit is further operable to generate a first pulse waveform having a plurality of output pulses based on the energy consumption data, each output pulse corresponding to a quantity of energy consumed. A wireless transmitter is coupled to the processing circuit, the wireless transmitter configured to transmit an energy consumption signal each time the first pulse waveform changes state.

In accordance with yet another exemplary embodiment, a method is provided for protecting against voltage spikes in a component connected to local ground, where the component is configured to receive a pulse waveform from a utility meter connected to ungrounded electrical service. The method comprises coupling a first RF communication module to a pulse output interface within the utility meter, the RF communications module including processing circuitry and wireless transmission circuitry, the processing circuitry configured to generate an energy consumption signal for a change in state of the pulse waveform, and the wireless transmission circuitry configured to transmit the energy consumption signal. The method further comprises coupling a second RF communication module to an input interface of the component, the RF communications module including processing circuitry and wireless transmission circuitry, the processing circuitry configured to receive the energy consumption signal and translate the energy consumption signal into a pulse of the pulse waveform.

The above described features and advantages, as well as others, will become more readily apparent to those of ordinary skill in the art by reference to the following detailed description and accompanying drawings. While it would be desirable to provide a utility meter that provides one or more of these or other advantageous features, the teachings disclosed herein extend to those embodiments which fall within the scope of the appended claims, regardless of whether they accomplish one or more of the above-mentioned advantages.

DETAILED DESCRIPTION

Figure 3:
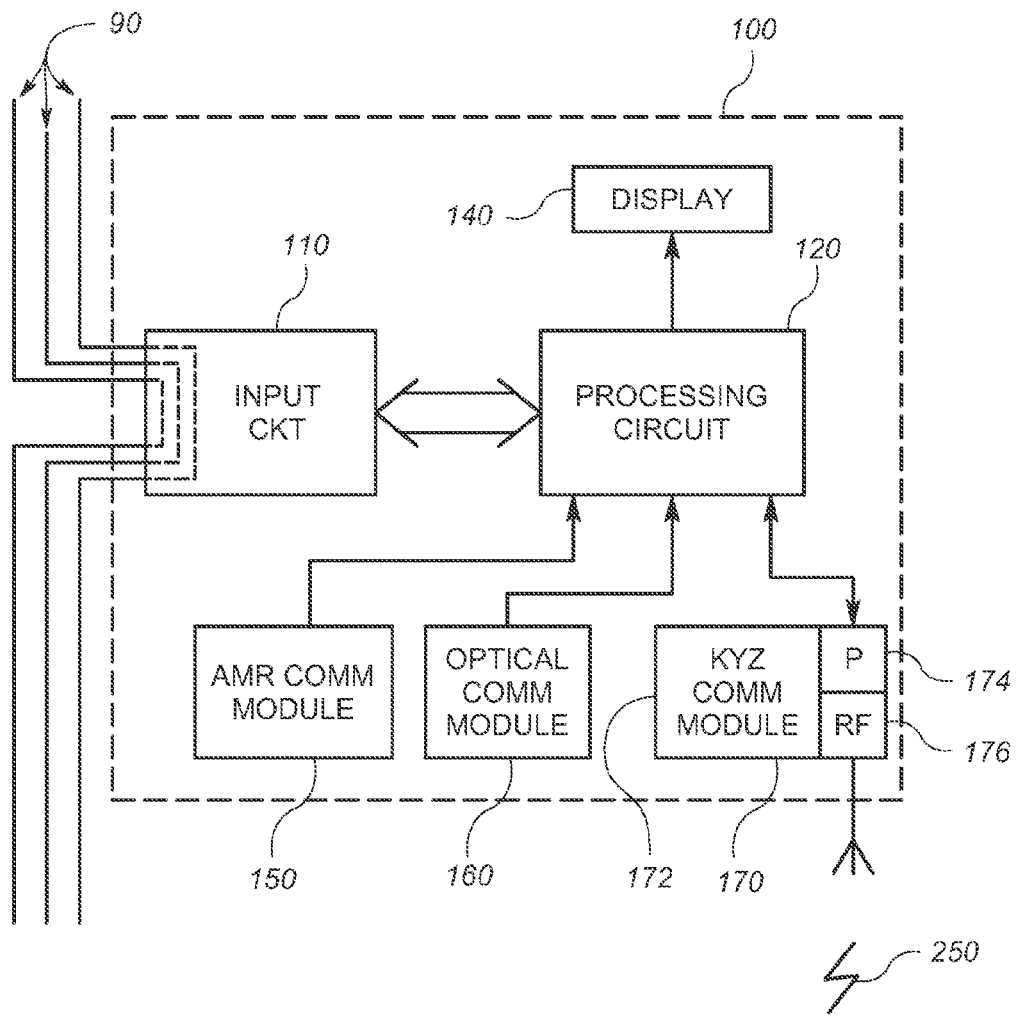
FIG. 3 shows a block diagram of an exemplary embodiment of a utility meter with a wireless pulse output interface.
Figure 3:
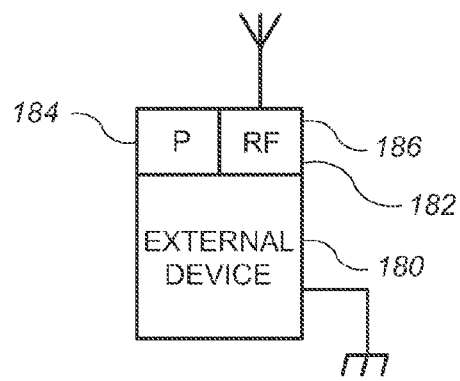

With reference now to FIG. 3, a block diagram of an exemplary implementation of an arrangement for measuring energy consumption is shown. The arrangement includes a meter 100 for measuring electrical energy consumption. The meter 100 includes an input circuit 110, a processing circuit 120, a display 140, an AMR communications module 150, an optical communications module 160, and a pulse output interface 170. The pulse output interface 170 is configured for wireless communications with an external device 180 that is housed separate from the meter 100 and is connected to other equipment. The external device 180 may be, for example, a load control device, pulse recorder, rate indicator, peak saver, or the like.

In the embodiment described herein, the input circuit 110 is a circuit operable to generate a first digital signal representative of a line voltage waveform from power lines 90, and a second digital signal representative of a line current waveform from power lines 90. To this end, the input circuit 110 may suitably comprise current and voltage sensors, not shown, and one or more analog-to-digital converters (not shown). Many circuits capable of generating digital voltage and current waveform signals are well known in the art. Suitable examples of input circuits having such capabilities are described in U.S. Pat. No. 7,167,804; U.S. Pat. No. 6,564,159; U.S. Pat. No. 6,374,188; U.S. Pat. No. 6,121,158; and U.S. Pat. No. 5,933,004, all of which are incorporated herein by reference. In the embodiment disclosed herein, the electrical service from the power lines 90 is ungrounded electrical service (e.g., an ungrounded delta service).

The processing circuit 120 is a device that employs one or more processing devices such as microprocessors, microcontrollers, digital signal processors, discrete digital circuits and/or combinations thereof. The processing circuit 120 is operable to generate energy consumption data based on the first digital signal and the second digital signal. For example, the processing circuit 120 may generate watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. No. 7,167,804; U.S. Pat. No. 6,564,159; U.S. Pat. No. 6,374,188; U.S. Pat. No. 6,121,158; and U.S. Pat. No. 5,933,004, mentioned above.

The energy consumption data generated by the processing circuit 120 may be delivered to the display 140 for presentation to an individual present at the meter 100 and viewing the display 140. In addition, the energy consumption date generated by the processing circuit 120 may be delivered to the AMR communications module 150 for transmission to an AMR network or other remote AMR device. Signals are transmitted to the remote AMR device/network and received from the remote AMR device/network according to a certain communications protocol. For example, the AMR network/device may require communication using ANSI protocol with a certain baud rate, data word length, stop bits, etc. Signals between the AMR communications module 150 and the remote AMR device/network may be communicated by any of various means used in the art, such as RF communication, power line communication, telephone line communication, or other means of communication.

The optical communications port 160 provides an additional means for communications with the processing circuit 120. The optical port 160 provides for communication via an optical link between a handheld device or other device external to the meter 100. Communications through the meter optical port are provided using a meter protocol having a predefined baud rate, data word length, stop bits, etc. The meter optical port 160 may be used for numerous different communications such as meter reading, meter programming, etc.

Figure 1:
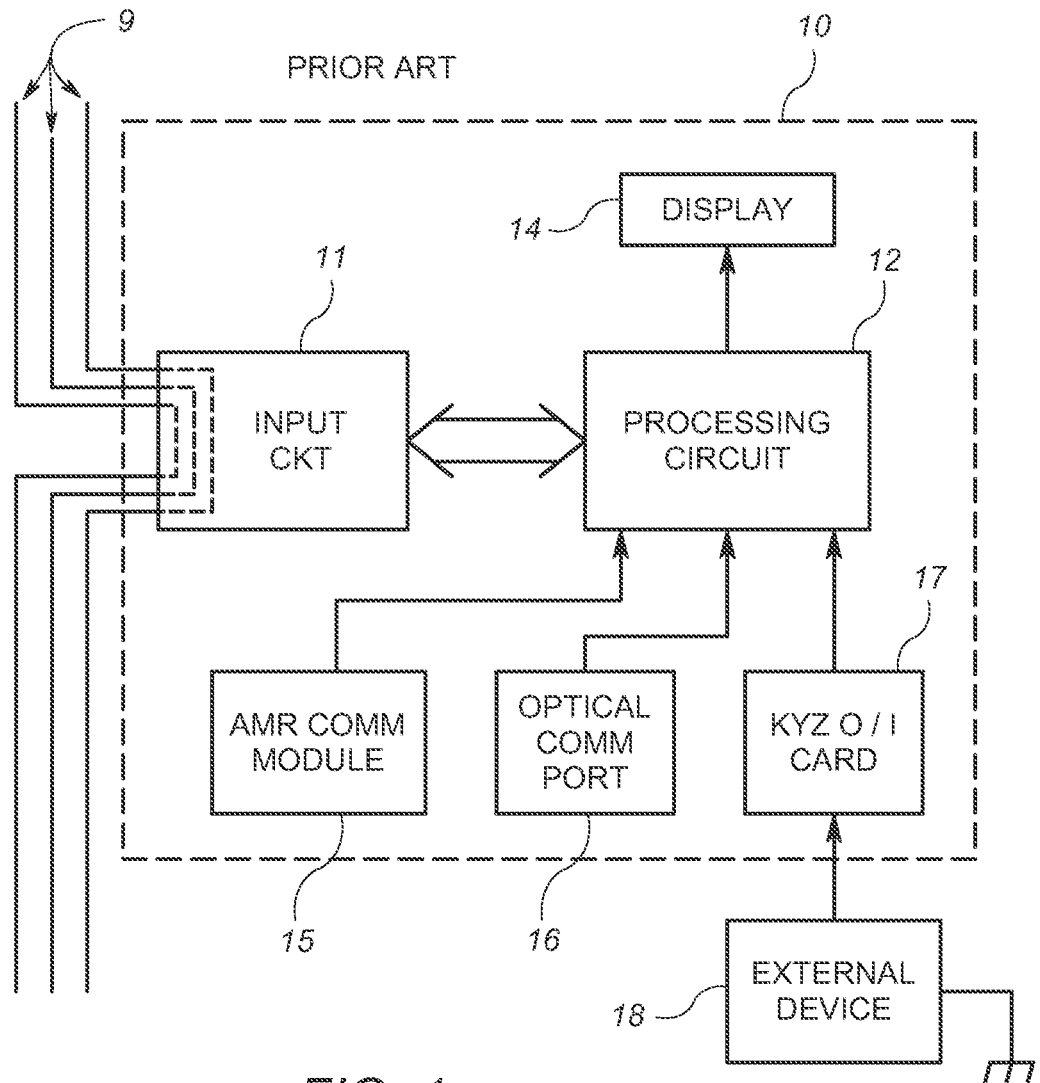
FIG. 1 shows a block diagram of an exemplary prior art utility meter with a pulse output wired to an external device.
Figure 2A:
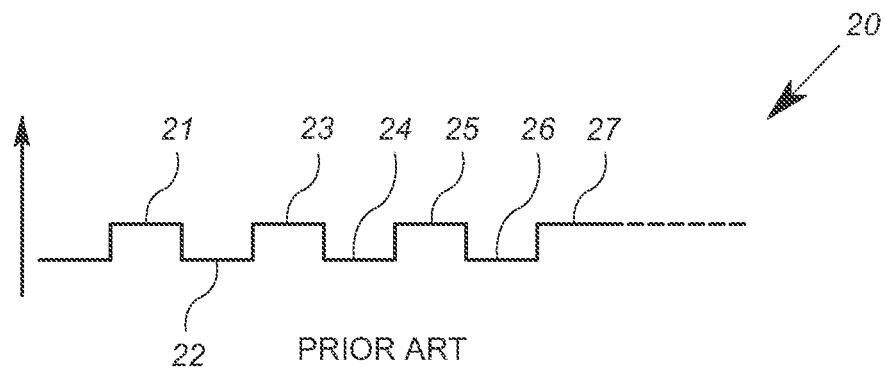
FIGS. 2a and 2b show exemplary pulse output waveforms for the pulse output of the utility meter of FIG. 1.
Figure 2B:
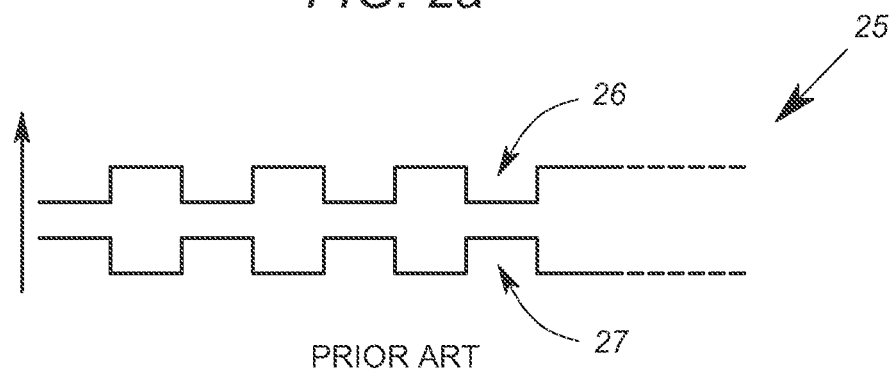

The processing circuit 120 is further operable to generate a first pulse waveform having a plurality of output pulses based on the energy consumption data, each output pulse corresponding to a quantity of energy consumed. Thus, in addition to generating energy consumption data, the processing circuit 120 is capable of generating any of a number of output pulse signals. In particular, the processing circuit 120 is configured to generate pulse waveforms such as those shown in FIGS. 2a and 2b for delivery to the pulse output interface 170 (i.e., the KYZ communication module in FIG. 3).

As discussed above, the pulse output interface 170 is configured for wireless communication with the external device 180. Accordingly, the pulse output interface 170 includes an RF communication module 172. The RF communication module 172 is a circuit that includes processing circuitry 174 and wireless transmission and reception circuitry 176. The RF communication module 172 is configured to generate RF messages representative of the on or off state signals (e.g., KYZ pulses) from the processing circuit 120. While in conventional meters these on or off state signals have been transferred by a wired connection, in the embodiment of FIG. 3, the meter 100 is configured to deliver the on or off state signals via a wireless connection. In particular, the RF communication module 172 operates to receive KYZ pulses from the processing circuit 120 and then generate and transmit an RF message corresponding to each pulse (i.e., transmit an RF message associated with each change in state of the KYZ pulse waveform).

The external device 180 is configured for wireless communication with the pulse output interface 170, and accordingly, is adapted to receive the RF messages transmitted by the RF communication module 172. Accordingly, the external device 180 also includes an RF communication module 182. The RF communication module 182 of the external device 180 is a circuit that includes processing circuitry 184 and wireless transmission and reception circuitry 186. The RF communication module 182 is configured to receive the RF messages from the pulse output interface 170 which are representative of the on or off state signals (e.g., KYZ pulses) from the processing circuit 120. Again, while these on or off state signals have conventionally been transferred by a wired connection, in the embodiment of FIG. 3 the external device 180 is configured to receive the on or off state signals via a wireless connection. In particular, the RF communication module 182 operates to receive wireless messages from the pulse output interface 170, and generate corresponding on or off state pulses within the external device 180 based on these messages. An exemplary protocol for wireless communications between the pulse output interface 170 and the external device is explained in further detail below.

In operation, the meter 100 is connected to measure power flowing through power lines 90. The input circuit 110 generates a digital voltage signal, which preferably is a series of digital samples that represent a scaled version of the voltage waveform(s) on the one or more of the power lines 90. The input circuit 110 also generates a digital current signal, which preferably is a series of digital samples that represent a scaled version of the current waveform(s) on the one or more of the power lines 90. The processing circuit 120 receives the digital voltage and current signals and generates energy consumption data, for example, data representative of kilowatt-hours or the like. The processing circuit 120 provides information representative of at least some of the energy consumption data to the display 140.

The processing circuit 120 further generates the first pulse waveform and provides the first pulse waveform to the pulse output interface 170. To this end, the processing circuit 120 generates the first pulse waveform based on the energy consumption data and stored information that defines the pulse output mode. In general, the energy consumption data will define the frequency of the pulses in the first pulse waveform, and the stored information will define the duration, shape and/or style of the pulses.

In at least one embodiment, the processing circuit 120 includes an input, such as an input via optical communications port 160, that is capable of receiving information that changes the configuration of the first pulse waveform. Alternatively, the input could be provided through the KYZ communication module 170. In such embodiment, the RF communications module 172 is configured to receive wireless transmissions from the RF communications module 182 of the external device 180. Accordingly, input information may be provided through the RF communications module 172 which is passed on to the processing circuit 120 in order to change the configuration of the first pulse waveform, or the message protocol for the KYZ communications module.

As stated previously, a pulse waveform is output from the processing circuit 120 to the pulse output interface 170. The pulse waveform can only have one of two states (i.e., a high or low state, an on or off state, etc.). Each pulse from the processing circuit 120 is representative of some electrical energy consumption parameter, such as the conventional KYZ pulse waveform. These pulses are useful to the exterior device 180 for various functions, such as load control, as discussed above. In the embodiment of FIG. 3, no wired connection exists between the pulse output interface 170 and the external device 180. Therefore, the change of state of the pulse waveform must be communicated from the pulse output interface 170 to the external device 180 via a wireless transmission. This is accomplished by sending a wireless message 250 from the pulse output interface 170 to the external device 180 each time the pulse waveform from the processing circuit 120 changes state. In at least one embodiment, the wireless message 250 from the pulse output interface 170 to the external device 180 is an energy consumption signal representative of a change in state of the KYZ pulse waveform. Because the pulse waveform is a simple waveform, a relatively simple communications protocol may be used for transmission of the wireless message from the pulse output interface 170 to the external device 180.

Figure 4:
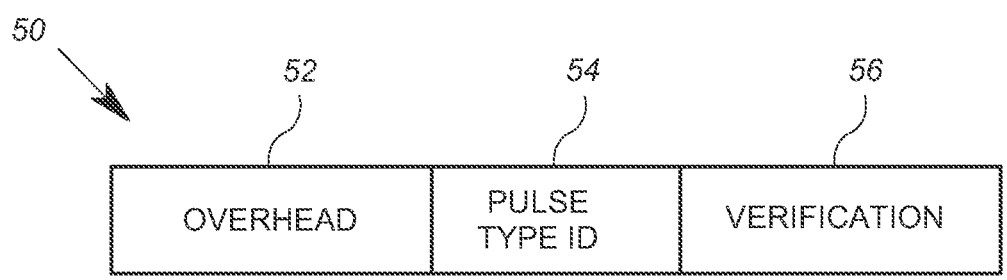
FIG. 4 shows a message format for an RF message transmitted by the wireless pulse output interface of FIG. 3.

With reference now to FIG. 4, an exemplary protocol for an RF message 250 transmitted from the pulse output interface 170 is illustrated. As shown in FIG. 4, the RF message 250 in this embodiment may include the normal communication overhead information 252, data 254 identifying the type of pulse, and verification information 256.

The communication overhead information 252 may be used to identify that the wireless transmission is from the meter 100, or other overhead information as will be recognized by those of skill in the art. Accordingly, the RF communication module 182 on the external device 180 may be programmed to only look for transmissions from the meter 100.

The pulse identification data 254 is used identify that the message 250 is representative of a change in state of a particular type of pulse, such as a KYZ pulse provided by the meter 100. In at least one embodiment the pulse identification data 254 may include other information about the pulse waveform itself, such as the frequency of the pulses in the first pulse waveform, the duration, shape and/or style of the pulse. This information may be used by the communications module 182 of the external device 180 to confirm that the proper pulse has been received from the meter 100 for use in the external device 180. Advantageously, because the communications module 182 of the external device 180 is also configured to deliver messages to the communications module 172 of the meter, changes in the external device 180 that call for a different pulse form may be communicated to the meter 100 by wireless transmission from the communications module 182 to the communications module 172, and then to the processing circuit 120 of the meter 100, This allows the processing circuit 120 to generate the appropriate pulse output for transmission to the external device 180.

With continued reference to FIG. 4, the verification information 256 included with each message 250 allows the RF communication module 182 on the external device to ensure that it has not missed any previously transmitted pulses. The verification information may include a count value representative of the number of prior transmissions for a pulse type currently being transmitted, or some other form of check-sum. To this end, both RF communication modules 172 and 182 should maintain (or have access to) counts for each type of pulse that can be transmitted. For example, if the verification information is that 14,244 previous pulses have been sent, the communications module 172 on the meter 100 will have a record of this number and include this number in the verification information transmitted with each message 250. When the message 250 is received by the communications module 182 of the external device 180, the communications module 182 will check the verification information against the number of previous pulses recorded by the communications module 182. If the communications module 182 confirms that 14,244 previous pulses have been received, the communications module can confirm that all pulses of the pulse waveform generated by the meter have been received. On the other hand, if the communications module notes a discrepancy, for example, if the communications module 182 only has a record of 12,243 pulses received, the communications module 182 will have an indication that a previous pulse was missed, and the communications module 182 may update the pulse waveform accordingly (e.g., by adding an additional quantity of electrical energy to the total electrical energy consumed). From time to time, the communications modules 172 and 182 may cooperate via a special message to reset the count values for the verification information.

As noted above, the RF communication module 182 of the external device 180 is configured to receive messages 250 transmitted from the communications module 172 of the meter 100, confirm that the message 250 is for the desired pulse type (using data 254), and then generate an output to the processing circuitry 184 of the external device 180 that corresponds to the pulse type. Each message 250 received causes the processing circuitry 184 to produce a change in state for the pulse waveform replicated at the external device 180. As also explained above, the RF message 250 transmitted from the meter 100 to the external device 180 also includes verification information 256 to ensure that previous transmissions have not been missed.

After receiving a message 250 transmitted from the communications module 172 of the meter 100, the RF communication module 182 of the external device 180 may also send an acknowledgement message to the communications module 172. This informs the pulse output interface 170 of the meter 100 that the message 250 has been received at the external device 180 and no further messages need to be sent from the communications module 172 of the pulse output interface 170 until the next change in state of the pulse waveform occurs. Accordingly, when the communications module 172 of the pulse output interface 170 transmits a message 250, it waits a predetermined period of time before resending the message 250. If the communications module 172 receives a confirmation message from the communications module 182 of the external device 180 before the predetermined period of time expires, the message is not re-sent, and no further messages are sent from the communications module 172 (related to the particular pulse waveform) until the pulse waveform changes state again. On the other hand, if the communications module 172 does not receive a confirmation message from the communications device 182 before the predetermined period of time expires, the communications module 172 assumes that the message 250 was not received by the external device 180, and the message is re-sent. In the event the communications module 182 of the external device 180 receives the same message 250 twice (e.g., because the communications module 172 of the pulse output interface 170 did not receive the confirmation message), the communications module 182 uses the verification information 256 to determine that this second message is a duplicate of a previous message, and simply disregards the duplicate message.

As explained in the previous paragraph, the RF messages passed between the communications module 172 of the pulse output interface 170 and the communications module 182 of the external device 180 result in the pulse output waveform generated by the processing circuit 120 of the meter 100 being reproduced at the external device 180. Thus, the RF messages passed between the communication devices 172, 182 simulate the line inputs to the external device 180 as if the pulse output interface 170 of the meter 100 and the interface of the external device 180 were directly connected in a wired system. However, the wireless system described above prevents voltage spikes from being passed from the meter 100 having ungrounded service to the external device 180 having a local ground. Also, while the verification information 256 is described above as being a number or check-sum arrangement, it will be recognized that the verification information 256 may employ any suitable protocol between the two radios 176, 186 that assures that each state change in the output pulse waveform is received by the wireless input signal interface 182 at the external device 180, thus assuring that the wireless connection between the meter 100 and the external device 180 is as reliable as a wired system.

In the embodiment described above in FIG. 3, the meter 100 may include two different RF interfaces: one RF interface for the pulse output interface 170 of the meter and another RF interface for the AMR communication module 150. However, in an alternative embodiment, the existing RF interface used within the meter for the AMR communications module 150 may also be used to provide the messages 250 representative of a state change in a pulse waveform, as described above. In such embodiment, the AMR communications module 150 would retain the ability to transmit messages to the AMR network using the appropriate AMR protocol (e.g., ANSI or other protocol) but would supplemented with the functionality to also support pulse output messages 250 and related inputs, as described above. In such an arrangement, the RF interface of the AMR communications module would spend some of its time transmitting messages to the AMR network according to the AMR protocol, and would also spend some of its time transmitting messages 250 representative of a pulse waveform (e.g., a KYZ pulse) which are typically delivered from the processing circuit 120 to the pulse output interface. This alternative arrangement would leverage the radio that is already installed in the meter for AMR communications and save cost and space occupied by the output/input board associated with the pulse output interface 170.

The arrangement described above may be used in a method for retrofitting existing arrangements having a meter and external equipment in order to protect against damaging voltage spikes. According to the method, the meter may be an electricity meter and the external equipment may be a device that receives pulse waveform information from the meter, such as for example, load control equipment in a building control system. According to the method, the wired connection between a meter 100 and an external device 180 is removed. Next, the wired KYZ output/input card 17 of the meter 100 is removed and replaced with the pulse output interface 170 with RF communication circuit 172 described above. Also, the I/O interface of the external device 180 (that was previously directly wired to the meter's I/O interface) is provided with the communication circuit 182 described above. Messages are then transmitted between the RF communication circuit 172 of the meter 100 and the RF communications circuit 182 of the external device. The messages 250 include messages transmitted from the meter 100 to the external device 180 which representative of a change in state of a pulse waveform generated by the meter 100, such as a KYZ pulse waveform. For example, the messages 250 may be energy consumption messages indicative of additional energy consumption measured by the electricity meter. Other RF messages may also be passed between the meter 100 and the remote device, such as confirmation messages that the remote device 180 has received the energy consumption message.

The foregoing detailed description of one or more embodiments of the utility meter has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. An arrangement for measuring energy consumption comprising:
   an input circuit operable to generate a first signal representative of a line voltage waveform and a second signal representative of a line current waveform;
   a processing circuit operable to generate energy consumption data based on the first signal and the second signal, the processing circuit further operable to generate a first pulse waveform having a plurality of output pulses based on the energy consumption data, each output pulse corresponding to a quantity of energy consumed, wherein the first pulse waveform is a KYZ waveform;
   a wireless transmitter coupled to the processing circuit, the wireless transmitter configured to transmit an RF signal each time the first pulse waveform changes state;
   wherein the each RF signal includes a message including overhead information and pulse information.

2. The arrangement for measuring energy consumption of claim 1, wherein the first pulse waveform has a pulse type, and wherein the pulse information includes data identifying the pulse type.

3. The arrangement for measuring energy consumption of claim 2, wherein the message further includes verification information.

4. The arrangement of claim 3, wherein the verification information includes a count value, the count value identifying a number of transmissions by the wireless transmitter over a period of time.

5. The arrangement of claim 4, wherein the count value identifies a number of prior transmissions for the pulse type.

6. The arrangement of claim 4, wherein the count value identifies a number of prior transmissions for the pulse type.

7. The arrangement for measuring energy consumption of claim 1, wherein the processing circuit and the wireless transmitter are retained within a meter housing of an electrical utility meter.

8. The arrangement for measuring energy consumption of claim 1 wherein the wireless transmitter is further configured to transmit the energy consumption data to an automated meter reading (AMR) device in an AMR arrangement, wherein the RF signal transmitted when the first pulse waveform changes state is delivered according to a message protocol that is different from an AMR message protocol.

9. The arrangement of claim 1 wherein the RF signal transmitted from the wireless transmitter includes verification information such that the external component can verify that the entire first pulse waveform has been received from the wireless transmitter for a predetermined period of time.

10. The arrangement of claim 1 wherein the electrical utility meter is connected to ungrounded electrical service.

11. The arrangement of claim 1 wherein the wireless transmitter is a first wireless transmitter within the electrical utility meter, and wherein the electrical utility meter further includes at least one second wireless transmitter configured to transmit automatic meter reading data to a remote device using an AMR protocol, and wherein the electrical utility meter further includes an optical port.

12. The arrangement of claim 1, wherein the message further includes verification information.

13. The arrangement of claim 12, wherein the verification information includes a count value, the count value identifying a number of transmissions by the wireless transmitter over a period of time.

14. A utility meter comprising:
    an input circuit coupled to ungrounded electrical service, the input circuit operable to generate a first signal representative of a line voltage waveform and a second signal representative of a line current waveform;
    a processing circuit operable to generate energy consumption data based on the first signal and the second signal, the processing circuit further operable to generate a first pulse waveform having a plurality of output pulses based on the energy consumption data, each output pulse corresponding to a quantity of energy consumed, wherein the first pulse waveform is a KYZ waveform;
    a wireless transmitter coupled to the processing circuit, the wireless transmitter configured to transmit an energy consumption signal each time the first pulse waveform changes state, wherein each energy consumption signal is an RF signal;
    wherein the each RF signal includes a message including overhead information and pulse information.

15. The utility meter of claim 14, wherein the message further includes verification information.

16. The arrangement of claim 15, wherein the verification information includes a count value, the count value identifying a number of transmissions by the wireless transmitter over a period of time.

17. The arrangement of claim 16, wherein the count value identifies a number of prior transmissions for the pulse type.

18. The utility meter of claim 14, wherein the processing circuit and the wireless transmitter are retained within a meter housing of an electrical utility meter.

19. The arrangement of claim 14 wherein the wireless transmitter is a first wireless transmitter of the utility meter, and wherein the utility meter further includes at least one second wireless transmitter configured to transmit automatic meter reading data to a remote device using an AMR protocol, and wherein the utility meter further includes an optical port.

\* \* \* \* \*